United States Patent
Schumacher et al.

(10) Patent No.: US 9,455,765 B2
(45) Date of Patent: Sep. 27, 2016

(54) COMMUNICATIONS CONNECTORS HAVING FREQUENCY DEPENDENT COMMUNICATIONS PATHS AND RELATED METHODS

(75) Inventors: Richard A. Schumacher, Dallas, TX (US); Scott Lynn Michaelis, Plano, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 294 days.

(21) Appl. No.: 14/342,826

(22) PCT Filed: Jul. 2, 2012

(86) PCT No.: PCT/US2012/045190
§ 371 (c)(1),
(2), (4) Date: Mar. 5, 2014

(87) PCT Pub. No.: WO2013/036319
PCT Pub. Date: Mar. 14, 2013

(65) Prior Publication Data
US 2014/0226455 A1    Aug. 14, 2014

Related U.S. Application Data

(60) Provisional application No. 61/531,723, filed on Sep. 7, 2011.

(51) Int. Cl.
*H04L 12/66* (2006.01)
*H04J 1/12* (2006.01)
(Continued)

(52) U.S. Cl.
CPC ............ *H04B 3/32* (2013.01); *H01R 13/6461* (2013.01); *H01R 24/64* (2013.01); *H01R 2107/00* (2013.01); *H05K 1/0228* (2013.01); *H05K 1/147* (2013.01); *H05K 2201/10189* (2013.01)

(58) Field of Classification Search
CPC .... H04B 3/32; H04R 12/6461; H04R 24/64; H04R 2107/00; H04K 1/0228; H04K 1/147; H04K 2201/10189
USPC .................... 370/463–465; 439/676
See application file for complete search history.

(56) References Cited

U.S. PATENT DOCUMENTS

| | | |
|---|---|---|
| 5,997,358 A | 12/1999 | Adriaenssens et al. |
| 6,137,866 A * | 10/2000 | Staber .................. H04M 11/062 379/413.03 |

(Continued)

OTHER PUBLICATIONS

Notification Concerning Transmittal of International Preliminary Report on Patentability, PCT/US2012/045190, mailed Mar. 20, 2014, 6 pages.

(Continued)

*Primary Examiner* — Thai Hoang
(74) *Attorney, Agent, or Firm* — Myers Bigel & Sibley, P.A.

(57) ABSTRACT

Communications connectors are provided that include a plurality of inputs that are arranged as differential pairs of inputs and a plurality of outputs that are arranged as differential pairs of outputs. A plurality of low frequency conductive paths are provided, each of which electrically connects a respective one of the inputs to a respective one of the outputs. These low frequency conductive paths are configured to pass signals having frequencies in a first frequency band while substantially attenuating signals having frequencies in a second frequency band that includes higher frequencies than the first frequency band. A plurality of second conductive paths are also provided. Each of the plurality of second conductive paths is electrically in parallel with at least a portion of a respective one of the low frequency conductive paths.

17 Claims, 9 Drawing Sheets

(51) Int. Cl.
*H04B 3/32* (2006.01)
*H01R 13/6461* (2011.01)
*H01R 24/64* (2011.01)
H01R 107/00 (2006.01)
H05K 1/02 (2006.01)
H05K 1/14 (2006.01)

(56) References Cited

U.S. PATENT DOCUMENTS

| | | | |
|---|---|---|---|
| 6,162,077 | A | 12/2000 | Laes et al. |
| 6,193,533 | B1 | 2/2001 | De Win et al. |
| 6,842,459 | B1* | 1/2005 | Binder .................. H04B 3/542 370/463 |
| 7,604,515 | B2 | 10/2009 | Siemon et al. |
| 8,170,053 | B2* | 5/2012 | Chen .................. H04L 12/4625 370/420 |
| 2003/0179868 | A1 | 9/2003 | Binder |
| 2004/0116081 | A1 | 6/2004 | Crudele et al. |
| 2004/0147165 | A1 | 7/2004 | Celella et al. |
| 2005/0010954 | A1* | 1/2005 | Binder ................ H01R 31/005 725/78 |
| 2006/0194550 | A1* | 8/2006 | Block ................... H04B 1/005 455/78 |
| 2006/0256947 | A1* | 11/2006 | Huang .................. H04M 3/007 379/219 |
| 2007/0015410 | A1 | 1/2007 | Siemon et al. |
| 2010/0003860 | A1 | 1/2010 | Ferrus et al. |
| 2010/0003863 | A1 | 1/2010 | Siemon et al. |
| 2010/0136835 | A1 | 6/2010 | Hashim et al. |
| 2011/0053431 | A1 | 3/2011 | Bopp et al. |
| 2011/0130163 | A1* | 6/2011 | Saban ................ H04W 88/085 455/517 |
| 2012/0044084 | A1* | 2/2012 | Astigarraga ........... H04Q 1/136 340/691.6 |
| 2012/0188865 | A1 | 7/2012 | Michaelis et al. |
| 2013/0225009 | A1* | 8/2013 | Hashim ............. H01R 13/6466 439/676 |

OTHER PUBLICATIONS

Notification of Transmittal of the International Search Report and Written Opinion, PCT/US2012/045190, mailed Dec. 27, 2012, 10 pages.

* cited by examiner

COMMUNICATIONS CONNECTORS HAVING FREQUENCY DEPENDENT COMMUNICATIONS PATHS AND RELATED METHODS

CROSS REFERENCE TO RELATED APPLICATIONS

This application is a U.S.C. §371national stage application of the PCT International Application No. PCT/US2012/ 045190, filed on Jul. 2, 2012, which itself claims priority to U.S. Provisional Patent Application Ser. No. 61/531,723, filed Sep. 7, 2011, the disclosure and content of each of which is incorporated by reference herein in its entirety. The above-referenced PCT International Application was published in the English language as International Publication No. WO 2013/036319 A1 on Mar. 14, 2013.

FIELD OF THE INVENTION

The present invention relates generally to communications connectors and, more particularly, to communications connectors that may exhibit improved performance over a wide frequency range.

BACKGROUND

Computers, fax machines, printers and other electronic devices are routinely connected by communications cables to network equipment such as routers, switches, servers and the like. FIG. 1 illustrates the manner in which a computer 10 may be connected to network equipment 20 using conventional communications plug/jack connections. As shown in FIG. 1, the computer 10 is connected by a patch cord 11 to a communications jack 30 that is mounted in a wall plate 18. The patch cord 11 comprises a communications cable 12 that contains a plurality of individual conductors (e.g., insulated copper wires) and first and second communications plugs 13, 14 that are attached to the respective ends of the cable 12. The first communications plug 13 is inserted into a communications jack that is provided in the computer 10 (this jack is not visible in FIG. 1), and the second communications plug 14 is inserted into a plug aperture 32 in the front side of the communications jack 30. The contacts or "blades" of the second communications plug 14 are exposed through the slots 15 on the top and front surfaces of the second communications plug 14 and mate with respective contacts of the communications jack 30. The blades of the first communications plug 13 similarly mate with respective contacts of the communications jack that is provided in the computer 10.

The communications jack 30 includes a back-end wire connection assembly 34 that receives and holds conductors from a cable 36. As shown in FIG. 1, each conductor of cable 36 is individually pressed into a respective one of a plurality of slots provided in the back-end wire connection assembly 34 to establish mechanical and electrical connection between each conductor of cable 36 and a respective one of a plurality of conductive paths (not shown in FIG. 1) through the communications jack 30. The other end of each conductor in cable 36 may be connected to, for example, the network equipment 20. The wall plate 18 is typically mounted on a wall (not shown) of a room or office of, for example, an office building, and the cable 36 typically runs through conduits in the walls and/or ceilings of the building to a room in which the network equipment 20 is located. The patch cord 11, the communications jack 30 and the cable 36 provide a plurality of signal transmission paths over which information signals may be communicated between the computer 10 and the network equipment 20. It will be appreciated that typically one or more patch panels, along with additional communications cabling, would be included in the electrical path between the cable 36 and the network equipment 20. However, for ease of description, in FIG. 1 the cable 36 is shown as being directly connected to the network equipment 20.

In the above-described communications system, the information signals that are transmitted between the computer 10 and the network equipment 20 are typically transmitted over a pair of conductors (hereinafter a "differential pair" or simply a "pair") rather than over a single conductor. An information signal is transmitted over a differential pair by transmitting signals on each conductor of the pair that have equal magnitudes, but opposite phases, where the signals transmitted on the two conductors of the pair are selected such that the information signal is the voltage difference between the two transmitted signals. The use of differential signaling can greatly reduce the impact of noise on an information signal.

Various industry standards, such as the TIA/EIA-568-B.2-1 standard approved Jun. 20, 2002 by the Telecommunications Industry Association, have been promulgated that specify configurations, interfaces, performance levels and the like that help ensure that jacks, plugs, cables and the like that are produced by different companies will all work together. The most commonly followed of these industry standards specify that each jack, plug and cable segment in a communications system must include a total of eight conductors 1-8 that are arranged as four differential pairs of conductors. The industry standards specify that, in at least the connection region where the contacts (blades) of a plug mate with the contacts of the jack (referred to herein as the "plug-jack mating region"), the eight conductors are generally aligned in a row. As shown in FIG. 2, under the TIA/EIA 568 type B configuration, conductors 4 and 5 in FIG. 2 comprise differential pair 1, conductors 1 and 2 comprise differential pair 2, conductors 3 and 6 comprise differential pair 3, and conductors 7 and 8 comprise differential pair 4. Conductors 1, 3, 5 and 7 are referred to as "tip" conductors, and conductors 2, 4, 6 and 8 are referred to as "ring" conductors.

Unfortunately, the industry-standardized connector configuration shown in FIG. 2, which was adopted many years ago, generates a type of noise known as "crosstalk." As is known to those of skill in this art, "crosstalk" refers to unwanted signal energy that is induced onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk degrade the information signal on the victim differential pair.

Various techniques have been developed for cancelling out the crosstalk that arises in industry standardized plugs and jacks. Many of these techniques involve including crosstalk compensation circuits in each communications jack that introduce "compensating" crosstalk that cancels out much of the "offending" crosstalk that is introduced in the plug and the plug-jack mating region due to industry-standardized plug-jack interface. In order to achieve high levels of crosstalk cancellation, the industry standards have for many years required that each communication plug introduce defined levels of crosstalk between the four differential pairs, which allows each manufacturer to design the crosstalk compensation circuits in their communications jacks to cancel out these predefined amounts of crosstalk. Typically, the communications jacks use "multi-stage" crosstalk compensation circuits as disclosed, for example, in U.S. Pat. No. 5,997,358 to Adriaenssens et al. (hereinafter "the '358 patent"), as these multi-stage crosstalk compensating schemes can provide significantly improved crosstalk cancellation, particularly at higher frequencies. The entire contents of the '358 patent are hereby incorporated herein by reference as if set forth fully herein.

DETAILED DESCRIPTION

Figure 1:
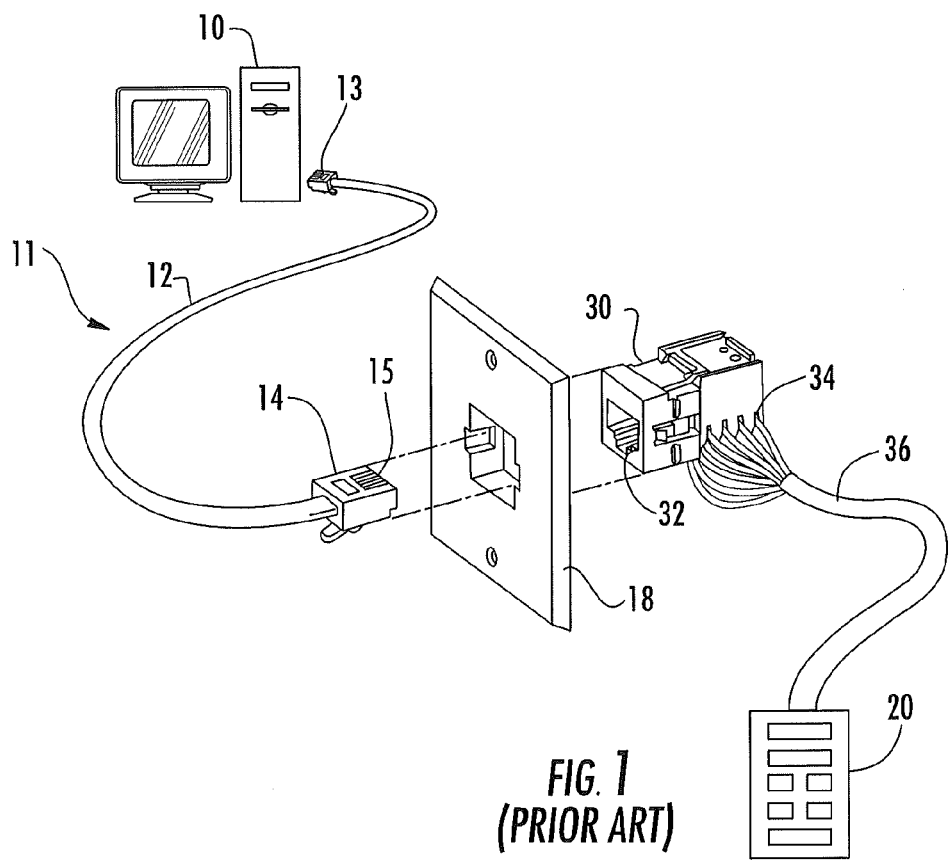
FIG. 1 is a schematic drawing that illustrates the use of communications plug-jack connectors to connect a computer to network equipment.

Pursuant to embodiments of the present invention, communications connectors such as RJ-45 plugs, jacks and mated plug-jack connectors are provided that include at least first and second sets of electrically parallel conductive paths. At least one of the first and second sets of conductive paths comprises frequency selective conductive paths that pass signals that are within a first range of frequencies while substantially attenuating signals that are within a second, different range of frequencies. By way of example, in some embodiments, the first set of conductive paths may pass signals at frequencies of about 500 MHz or less, while substantially attenuating signals at higher frequencies. In such embodiments the second set of conductive paths may be designed to pass signals at frequencies exceeding 500 MHz, while substantially attenuating signals at lower frequencies. The first set of conductive paths may be designed to meet applicable industry standards for one or more of NEXT, FEXT, insertion loss, return loss, conversion loss and the like so that the communications connectors will comply with various industry standards. The second set of conductive paths may be designed to have reduced crosstalk along with acceptable insertion loss, return loss, conversion loss and the like for frequencies in the range of, for example, 500 MHz to 3000 MHz or more so as to provide high channel capacity in this higher frequency range. In some embodiments, each conductive path in the first set of conductive paths may be substantially isolated from its parallel conductive path in the second set of conductive paths.

The communications connectors according to certain embodiments of the present invention may include a filter network that may be used to route signals that are input to the communications connector onto the appropriate one(s) of the first and second conductive paths. For example, in some embodiments, low pass or band pass filters may be provided that only allow lower frequency signals onto the low frequency conductive paths, and band pass or high pass filters may be provided that only allow higher frequency signals onto the high frequency conductive paths.

In some embodiments, the communications connector may comprise an RJ-45 plug, and each of the eight communications paths through this RJ-45 plug may split into two different paths, with a low pass filter provided on one of the two paths and a high pass filter provided on the other of the two paths to provide low and high frequency conductive paths. These filters may be implemented for example in one or more printed circuit board mounted integrated circuit chips or as discrete components mounted on a printed circuit board. In some embodiments, first and second low pass filters may be provided on each low frequency conductive path and/or first and second high pass filters may be provided on each high frequency conductive path so as to allow frequency band specific processing to be performed on either or both low frequency signals and/or high frequency signals that are passed through the connector.

In, for example, RJ-45 plug embodiments of the above-described communications connectors, the blades of the plug may be (but need not be) skeletal plug blades or surface contact plug blades that may generate crosstalk levels that are substantially below the predefined crosstalk levels specified in the relevant industry standards. In such embodiments, each low frequency conductive path may have first and second low pass filters included thereon, and additional reactive components such as capacitors may be coupled between certain of the low frequency conductive paths (e.g., between plug blades 2 and 3; blades 3 and 4; blades 5 and 6; and blades 6 and 7). These additional reactive components may be used to intentionally generate additional "offending" crosstalk so that the RJ-45 plug meets the industry standardized crosstalk requirements for the frequency ranges where such crosstalk levels are specified. Corresponding reactive components may be omitted from the high frequency conductive paths so that those paths may have reduced crosstalk levels. In this manner, an industry standards compliant plug may be provided that may also be used to carry high capacity signals in higher frequency bands that fall outside of the industry standards. It will likewise be appreciated that in other embodiments reactive components may be provided on some or all of the high frequency conductive paths, although these components would typically be different in type, size and/or configuration from the reactive components that are provided on the low frequency conductive paths. By way of example, reactive components that generate compensating crosstalk could be provided on some or all of the high frequency conductive paths in some embodiments.

Embodiments of the present invention will now be described with reference to the accompanying drawings, in which exemplary embodiments are shown.

Figure 3:
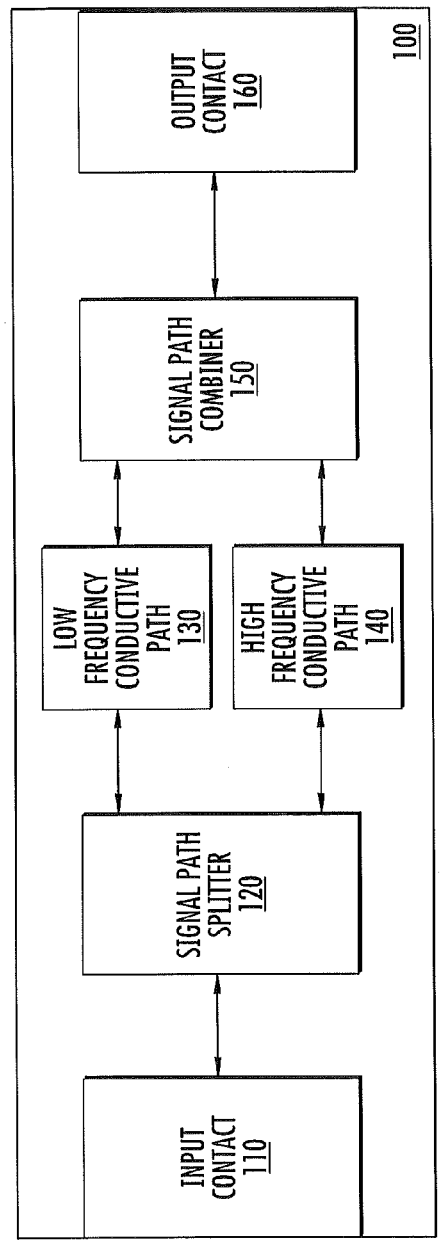
FIG. 3 is a block diagram of a communications connector according to embodiments of the present invention.

FIG. 3 is a block diagram of a communications connector 100 according to certain embodiments of the present invention. The communications connector 100 could be, for example, a communications plug (e.g., an RJ-45 plug) or a communications jack (e.g., an RJ-45 jack) or the mated combination of a plug and a jack. As shown in FIG. 3, the communications connector 100 includes an input contact 110. This input contact 110 may be any appropriate contact for transferring a communications signal into the communications connector 100. Exemplary contacts that may be used as the input contact 110 include insulation displacement contacts (IDCs), insulation piercing contacts, plug blades, jackwire contacts, pad contacts, clasp contacts, etc. The input contact 110 is electrically connected to a signal path splitter circuit 120. As shown in FIG. 3, the signal path splitter circuit 120 splits the conductive path from the input contact 110 into two electrically parallel conductive paths.

In some embodiments, the first of the two conductive paths output by the signal path splitter 120 comprises a first frequency selective conductive path 130, and the second of the two conductive paths output by the signal path splitter 120 comprises a second frequency selective conductive path 140. Both the first and second frequency conductive paths 130, 140 are input to a signal path combiner 150. The signal path combiner 150 combines any signals that are present on the first and second frequency selective conductive paths 130, 140 and provides this combined signal to an output contact 160. The output contact 160 is used to output the combined signal from the communications connector 100 to a cable, a connector, a device or the like. Exemplary contacts that may be used as the output contact 160 include insulation displacement contacts (IDCs), insulation piercing contacts, plug blades, jackwire contacts, pad contacts, clasp contacts, plated-thru-holes that are routed in half, etc. It will be appreciated that signals may often travel in both directions through communications connector 100, so if the direction of the signal is reversed the output contact 160 will act as an input contact and the input contact 110 will act as an output contact.

The first frequency selective conductive path 130 may be designed to pass signals at frequencies in one or more first frequency bands while substantially attenuating signals in other frequency bands. By way of example, in some embodiments, the first frequency selective conductive path 130 may be designed to pass signals at frequencies of less than about 500 MHz while substantially attenuating signals at higher frequencies. The second frequency selective conductive path 140 may be designed to pass signals at frequencies in one or more second frequency bands while substantially attenuating signals in other frequency bands. By way of example, in some embodiments, the second frequency selective conductive path 130 may be designed to pass signals at frequencies higher than about 600 MHz while substantially attenuating signals at lower frequencies. It will be appreciated that in some embodiments one of the first or second frequency selective conductive paths 130, 140 may be designed to pass signals at all frequencies.

As will be explained in more detail below, the provision of the first or second frequency selective conductive paths 130, 140 allows different signal processing to be performed on signals in different frequency ranges. By way of example, crosstalk generating and/or crosstalk compensation circuits may be provided on one of the first or second frequency selective conductive paths 130, 140 and not provided on the other. As will be discussed in more detail below, the performance of the communication connector 100 may be improved over a wider frequency range as compared to prior art connectors by transmitting signals at certain predefined frequency ranges over the first frequency selective conductive path 130 while transmitting signals at other frequencies over the second frequency selective conductive path 140.

Figure 4:
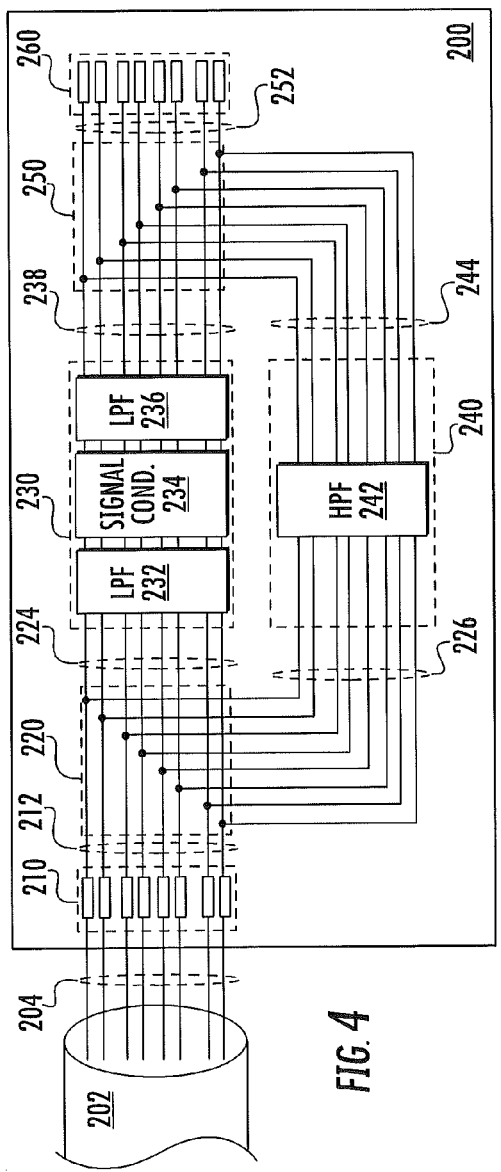
FIG. 4 is a schematic circuit diagram of a communications connector according to certain embodiments of the present invention.

As discussed above, many communications connectors such as RJ-45 plugs and jacks include more than one conductive path therethrough. FIG. 4 is a circuit diagram of a communications connector 200 according to certain embodiments of the present invention that includes multiple conductive paths that may carry multiple signals. The communications connector 200 may comprise, for example, an RJ-45 communications plug that has eight conductive paths that are configured to carry four differential signals or an RJ-45 jack that has eight conductive paths that are configured to carry four differential signals. As is discussed below, in the particular embodiment depicted in FIG. 4, the connector 200 includes a plurality of low frequency conductive paths and a plurality of high frequency conductive paths, and provides additional signal processing for the signals that are passed through the connector 200 via the low frequency conductive paths.

As shown in FIG. 4, a communications cable 202 is provided that includes at least eight conductors 204. Each one of the conductors 204 is terminated into a respective one of a plurality of input contacts 210 of the connector 200. Each input contact 210 may comprise, for example, an IDC or an insulation piercing contact. A plurality of conductive paths 212 are provided that electrically connect each input contact 210 to a signal path splitter circuit 220. In some embodiments, the signal path splitter circuit 220 may be coupled directly to the input contacts 210 so that some or all of the conductive paths 212 may be omitted.

As shown in FIG. 4, the signal path splitter circuit 220 splits each of the conductive paths 212 that are input thereto into two conductive paths 224, 226. The signal path splitter circuit 220 may comprise, for example, a plurality of conductive traces, each of which has another conductive trace branching off therefrom. Each of the conductive paths 224 that comprises the first output from the signal path splitter circuit 220 is coupled to a corresponding one of a plurality of low frequency conductive paths 230. As shown in FIG. 4, the low frequency conductive paths 230 are formed using a first bank of low pass filters (the bank of low pass filters is labeled "LPF" in the drawings) 232 and a second bank of low pass filters 236. The first and second banks of low pass filters 232, 236 may each comprise, for example, either a plurality of individual low pass filters or, alternatively, an integrated circuit chip that includes a low pass filter for each of the low frequency conductive paths 230. It will also be appreciated that in some embodiments the low pass filters 232, 236 could be replaced with band pass filters that, for example, attenuate very low frequency signals (e.g., signals at frequencies below 1 MHz) and also attenuate signals above a certain cut-off frequency (e.g., 500 MHz).

As is further shown in FIG. 4, one or more signal conditioning circuits 234 are provided along the low frequency conductive paths 230. By way of example, crosstalk compensation circuits, crosstalk generation circuits, return loss compensation circuits and the like may be provided that will condition the signals that are passed along the low frequency conductive paths 230. The provision of low frequency conductive paths 230 and high frequency conductive paths 240 allows for different signal conditioning to be applied to input signals that are in different frequency ranges.

Each of the conductive paths 226 that comprises the second output from the signal path splitter circuit 220 is coupled to a corresponding one of a plurality of high frequency conductive paths 240. As shown in FIG. 4, the high frequency conductive paths 240 are formed using a bank of high pass filters 242 (the bank of high pass filters is labeled "HPF" in the drawings). In the depicted embodiment, no special signal conditioning is applied to the high frequency signals, and hence no signal conditioning circuit is provided along the high frequency conductive paths 240. Additionally, in the depicted embodiment, only a single bank of high pass filters is provided. The bank of high pass filters 242 may comprise, for example, a plurality of individual high pass filters or may instead comprise an integrated circuit chip that includes a high pass filter for each of the conductive paths 240. It will also be appreciated that some or all of the high pass filters could be replaced with band pass filters that pass signals within a band of frequencies above a certain cut-off frequency (e.g., 500 MHz), but attenuate signals below the cut-off frequency and also attenuate signals at frequencies above another cut-off frequency (e.g., 2 GHz, 3 GHz, etc.).

A plurality of conductive paths 238 connect each low frequency conductive path 230 to a signal path combiner circuit 250. A plurality of conductive paths 244 connect each high frequency conductive path 240 to the signal path combiner circuit 250. As shown in FIG. 4, the signal path combiner circuit 250 combines each of the conductive paths 238 with its counterpart (i.e., parallel) conductive path 244. A plurality of conductive paths 252 are output from the signal path combiner circuit 250 and connected to respective ones of a plurality of output contacts 260. The output contacts 260 may comprise, for example, plug blades, jackwire contacts, etc.

As shown in FIG. 4, each signal that is input to the connector 200 is split into two components that are transmitted through the connector 200 on electrically parallel low frequency and high frequency conductive paths. The signals are then recombined and output from the connector 200. Different types of signal processing may be performed on the electrically parallel low frequency and high frequency conductive paths, as will be discussed in more detail below.

Pursuant to some embodiments of the present invention, communications connectors may be provided that use electrically parallel low frequency and high frequency conductive paths to provide improved crosstalk performance. For example, in some embodiments, communications plugs are provided that exhibit improved crosstalk performance at high frequencies (e.g., frequencies greater than 500 MHz) while still fully complying with the industry standards for crosstalk levels at frequencies below 500 MHz.

By way of background, various industry standards specify the amount of crosstalk (as a function of frequency) that must be present between each of the differential pairs of a communications plug for the plug to be compliant with the standard. For example, Table C.6 of Section C.4.10.3 of the TIA/EIA-568-C.2 or "Category 6A" standard sets forth ranges for the pair-to-pair NEXT and FEXT levels that a plug must meet to be compliant with the standard. Other industry standards (e.g., the Category 6 standard) have similar requirements. Thus, while techniques are available that could be used to design RJ-45 communications plugs that have lower pair-to-pair NEXT and FEXT levels—which levels would be easier to compensate for in the communications jacks—the installed base of existing RJ-45 communications plugs and jacks have offending crosstalk levels and crosstalk compensation circuits, respectively, that were designed based on the industry standard specified levels of plug crosstalk. Consequently, lowering the crosstalk in the plug has generally not been an available option for further reducing crosstalk levels to allow for communication at even higher frequencies, as such lower crosstalk jacks and plugs would typically (without special design features) exhibit reduced performance when used with the industry-standard compliant installed base of plugs and jacks.

Figure 5:
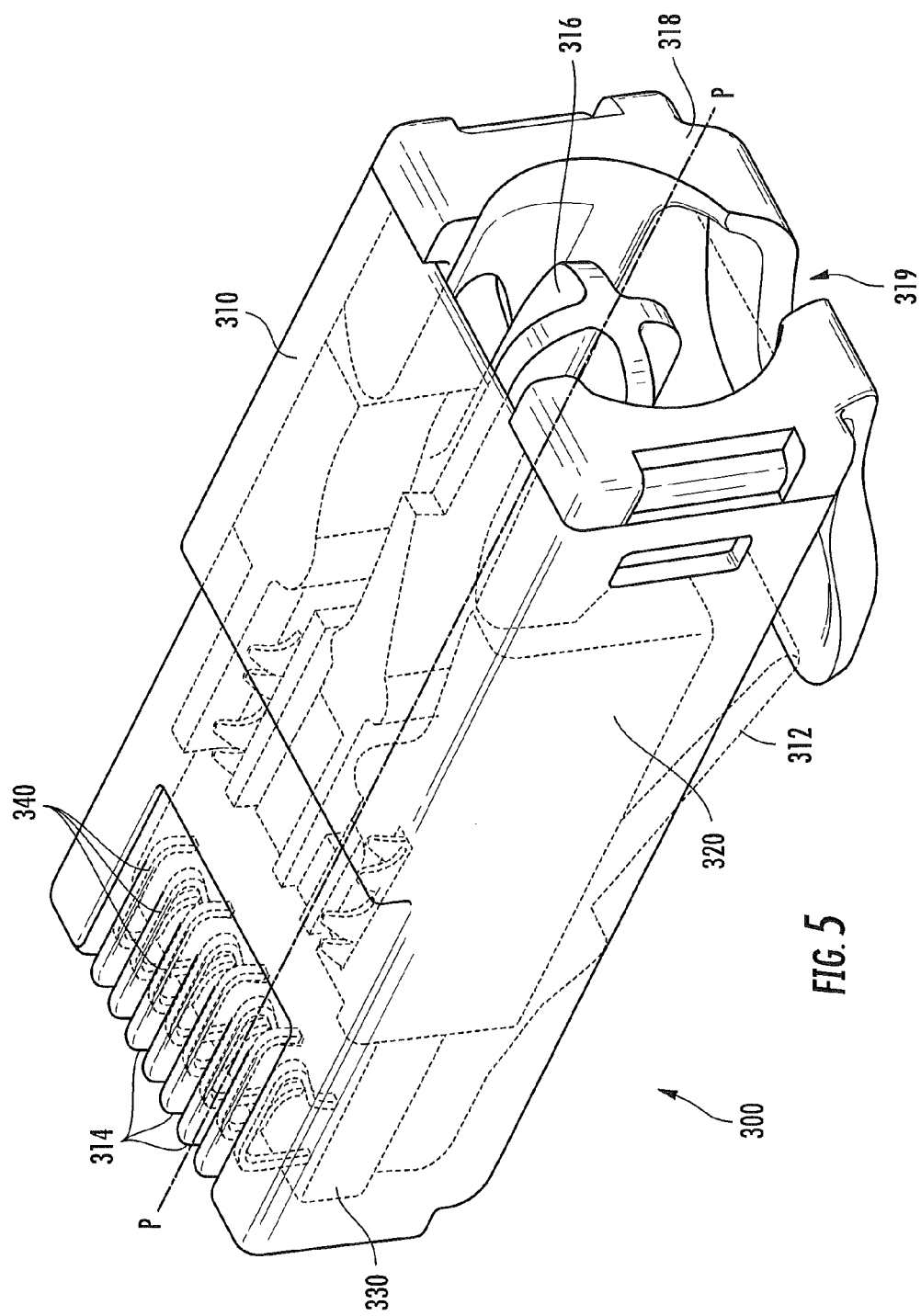
FIG. 5 is a perspective view of a communications plug according to embodiments of the present invention.
Figure 6:
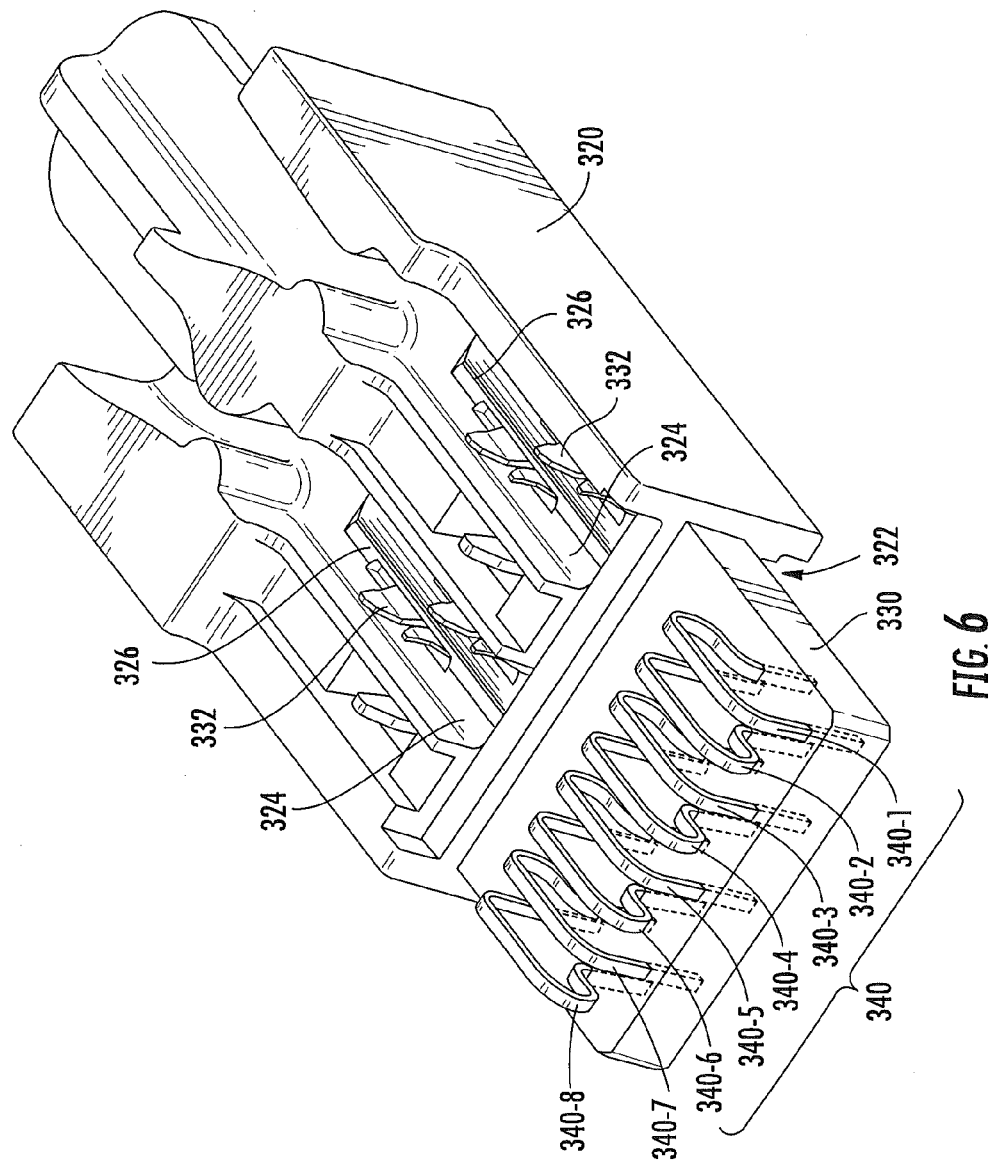
FIG. 6 is a top perspective view of the communications plug of FIG. 5 with the plug housing removed.
Figure 7:
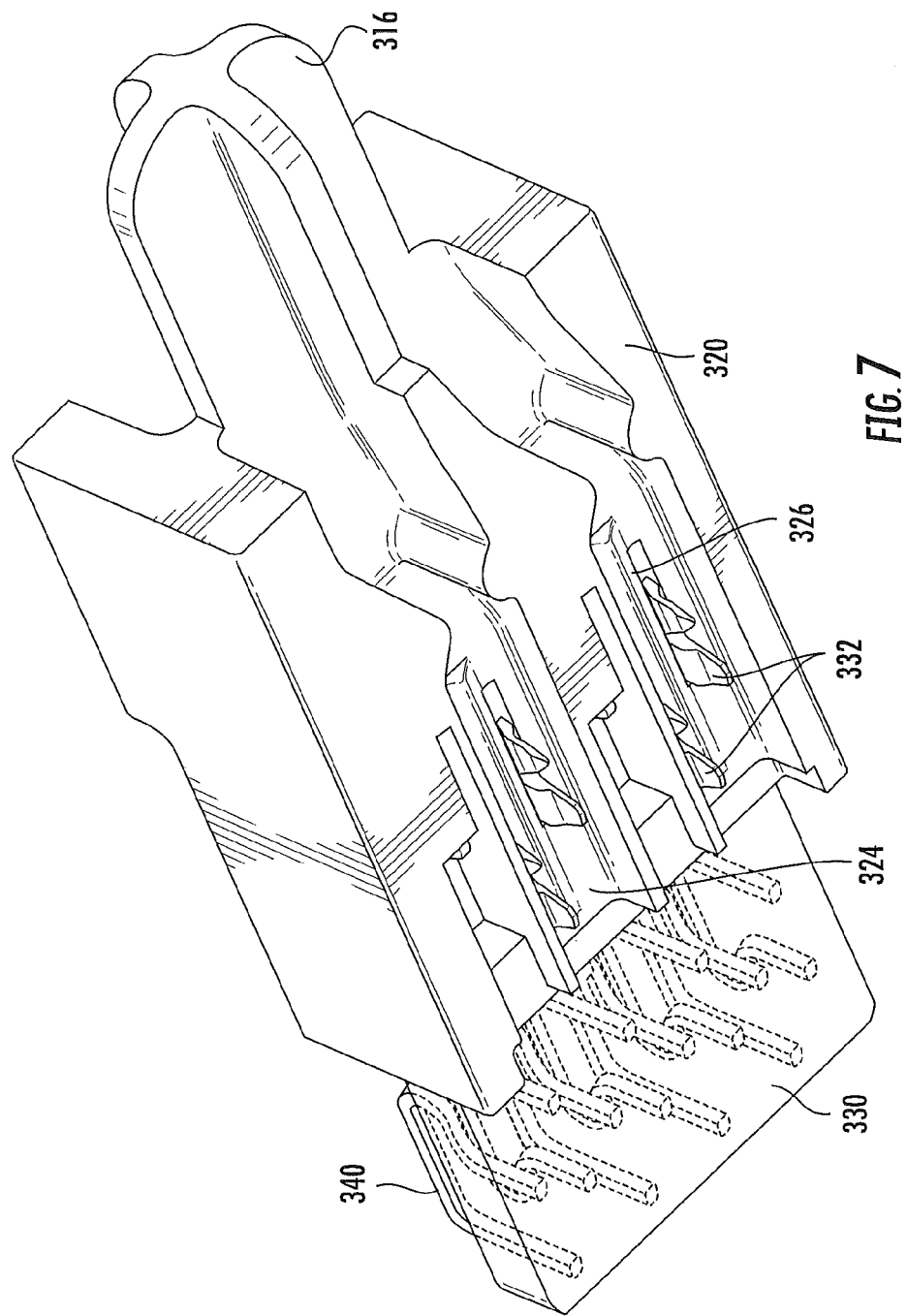
FIG. 7 is a bottom perspective view of the communications plug of FIG. 5 with the plug housing removed.
Figure 8:
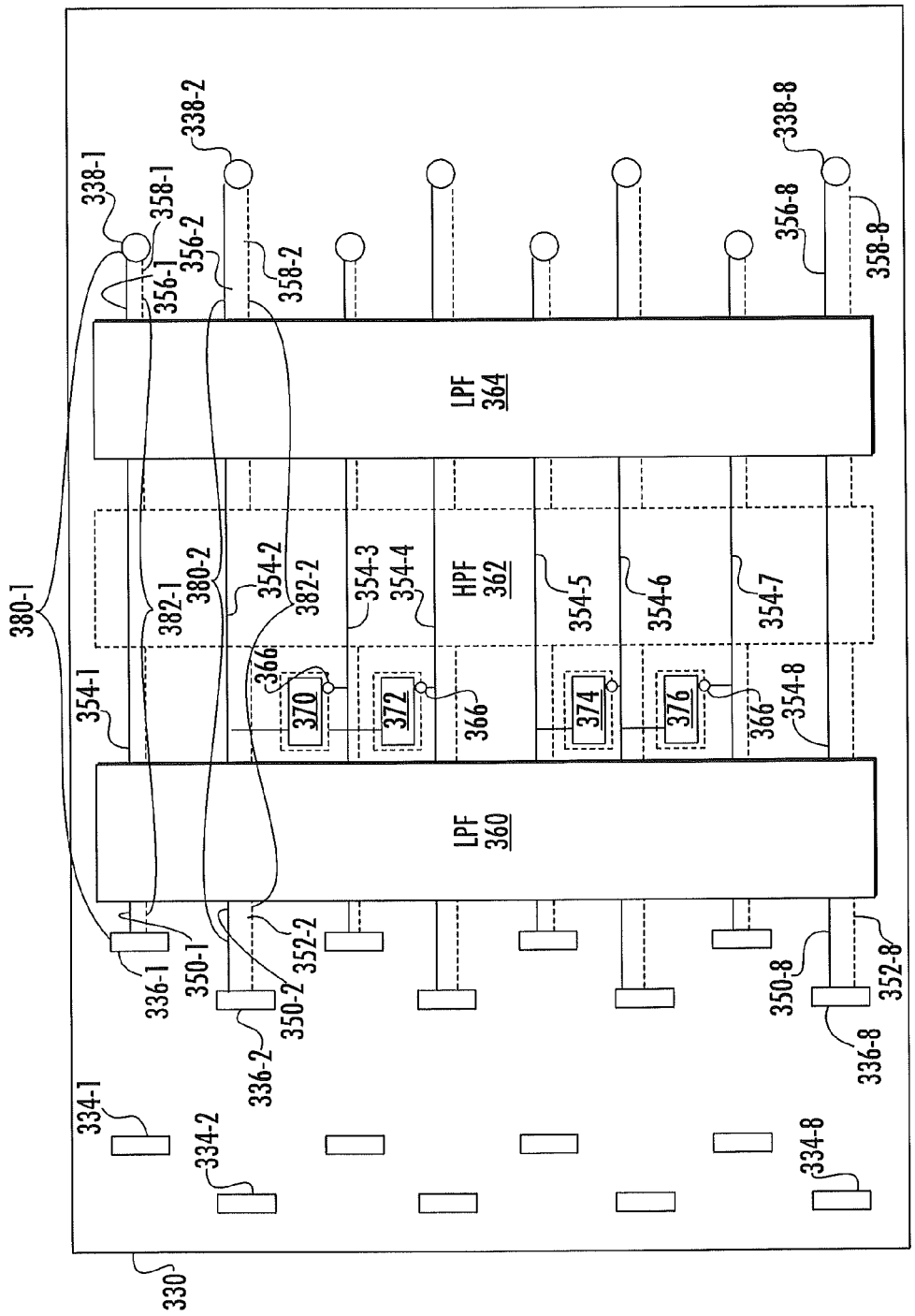
FIG. 8 is a schematic plan view of the printed circuit board of the communications plug of FIG. 5.

Pursuant to embodiments of the present invention, communications plugs are provided that may be designed to fully comply with the applicable industry standards (e.g., the pair-to-pair NEXT and FEXT levels) at the frequency ranges specified in the standards. However, by providing, for example, separate (electrically parallel) low frequency and high frequency conductive paths, these plugs may be designed to exhibit lower crosstalk levels at higher frequencies (e.g., frequencies above 500 MHz, above 600 MHz, above 1 GHz, etc.), and thus may exhibit improved performance at higher frequencies as compared to conventional communications plugs. An exemplary RJ-45 communications plug 300 according to embodiments of the present invention that provides such enhanced performance will now be discussed with respect to FIGS. 5-8. FIG. 5 is a perspective view of the communications plug 300. FIGS. 6 and 7 are a top perspective view and a bottom perspective view, respectively, of the communications plug 300 with the plug housing removed. FIG. 8 is a schematic plan view of the printed circuit board of the communications plug 300.

As shown in FIG. 5, the communications plug 300 includes a dielectric housing 310. The top and front faces of the housing 310 include a plurality of longitudinally extending slots 314 that expose a plurality of plug contacts or "blades" 340. A separator 316 is positioned within an opening in the rear face of the housing 310. A jacketed communications cable (not shown) that includes four twisted pairs of insulated conductors may be received through the opening in the rear face of the housing 310 and the jacket may be placed over the separator 316. Each twisted pair of conductors of this cable is received within one of the four quadrants of the separator 316. A rear cap 318 that includes a cable aperture 319 locks into place over the rear face of housing 310 after the communications cable has been inserted into the rear face of the housing 310.

As shown in FIGS. 5-7, a termination manager 320 and a printed circuit board 330 are each disposed within the housing 310. The termination manager 320 has a front opening 322 that receives the rear end of the printed circuit board 330. In the pictured embodiment, the printed circuit board 330 comprises a multi-layer printed circuit board. Eight plug blades 340 are mounted near the forward top edge of the printed circuit board 330 so that the blades 340-1 through 340-8 can be accessed through the slots 314 in the top and front faces of the housing 310 (see FIG. 5). Note that in FIGS. 5-8 groups of related elements such as the plug blades 340-1 through 340-8 may be individually identified (e.g., plug blade 340-3) or may be collectively referred to using the common reference numeral that is to the left of the dash (e.g., the plug blades 340-1 through 340-8 may be collectively referred to as plug blades 340).

The plug blades 340 are generally aligned in side-by-side fashion in a row. In the depicted embodiment, each of the eight plug blades 340 comprises a wire that is mounted into spaced-apart apertures in the printed circuit board 330. A first end of each wire is mounted in a first aperture in the printed circuit board 330, and a second end of each wire 340 is mounted in a second aperture in the printed circuit board 330. Each wire forms a "skeletal" plug blade 340. By "skeletal" it is meant that the plug blade 340 has an outer skeleton or shell and a hollow or open area in the center. Thus, in contrast to traditional plug blades for RJ-45 style plugs, each blade 340 has an open interior. The use of such skeletal plug blades 340 may facilitate reducing crosstalk levels between adjacent plug blades 340 by reducing the capacitive and/or inductive coupling between adjacent plug blades 340 of different differential pairs. As shown in FIG. 6, each plug blade 340 includes a U-shaped projection that extends in the longitudinal direction of the plug 300. The U-shaped projections on adjacent plug blades 340 point in opposite directions. This arrangement may further reduce the amount of crosstalk generated between adjacent plug blades 340.

As shown in FIGS. 6 and 7, eight output contacts 332 are mounted at the rear of printed circuit board 330, with four of the output contacts 332 (see FIG. 6) mounted on the top surface of printed circuit board 330 and the remaining four output contacts 332 (see FIG. 7) mounted on the bottom surface of printed circuit board 330. Each output contact 332 may be implemented, for example, as an insulation piercing contact 332 that includes a pair of sharpened triangular cutting surfaces. The insulation piercing contacts 332 are arranged in pairs, with each pair corresponding to one of the twisted differential pairs of conductors in the communications cable that is connected to plug 300. It will be appreciated that other types of output contacts such as insulation displacement contacts (IDCs) could be used.

The top and bottom surfaces of the termination manager 320 each have a plurality of generally rounded channels 324 molded therein. Each channel 324 guides a respective one of the eight insulated conductors of the communications cable so as to be in proper alignment for making electrical connection to a respective one of the insulation piercing contacts 332. Each of the insulation piercing contacts 332 extends though a respective opening 326 in one of the channels 324. When an insulated conductor of the cable is pressed against its respective insulation piercing contact 332, the sharpened triangular cutting surfaces pierce the insulation to make physical and electrical contact with the conductor. Each insulation piercing contact 332 includes a base post (not shown) that is mounted in, for example, metal plated apertures in the printed circuit board 330.

FIG. 8 is a schematic plan view of the printed circuit board 330. The printed circuit board 330 is a two layer printed circuit board that includes conductive traces on its top side and its bottom side. Dotted lines are used to illustrate traces/circuits that are on the bottom side, and solid lines are used to illustrate traces/circuits that are on the top side. It will be appreciated that FIG. 8 is a schematic diagram and is not intended to illustrate the actual placement of the conductive paths, circuit elements, integrated circuit chips and the like that are included in or on printed circuit board 330. In practice, such placement would consider a wide variety of factors such as the impact on insertion loss, return loss, crosstalk, current-carrying capabilities of traces and layers, heat dissipation and various other factors. It will also be appreciated that each of the conductive paths shown in FIG. 8 may, for example, be implemented as one or more conductive traces on one or more layers of the printed circuit board 330 and, as necessary, metal-filled holes or other layer-transferring techniques may be used to electrically connect conductive traces that reside on different layers.

Likewise, the plate capacitors shown in FIG. 8 that are used to inject offending crosstalk (see discussion below) may, for example, alternatively be implemented using inter-digitated finger capacitors or replaced (or augmented) by other capacitive and/or inductive coupling structures that are known in the art. Thus, while FIG. 8 is a schematic diagram that illustrates a functional layout of the printed circuit board 330, it will be appreciated that an actual implementation may look quite different from FIG. 8.

As shown in FIG. 8, the printed circuit board 330 includes a first set of eight metal-plated apertures 334. In FIG. 8, only three of the metal-plated apertures 334 are labeled with reference numerals (namely metal-plated apertures 334-1, 334-2 and 334-8) in order to simplify the drawing. It will be appreciated that the unlabeled metal-plated apertures that are disposed between apertures 334-2 and 334-8 are apertures 334-3 through 334-7. Applicants have used the same convention for labeling the sets of metal-plated apertures 336 and 338 and for labeling the sets of conductive traces 350, 352, 356 and 358 in FIG. 8 (these elements are discussed below) in order to improve the readability of FIG. 8.

Each of the metal-plated apertures 334-1 through 334-8 holds the end of a respective one of the plug blades 3404 through 340-8. The printed circuit board 330 also includes a set of eight metal-plated apertures 336 that hold the other ends of the respective plug blades 340. The printed circuit board 330 further includes an additional set of eight metal-plated apertures 338 that each hold the base post of a respective one of the insulation piercing contacts 332.

As shown in FIG. 8, a first low pass filter integrated circuit chip 360 is mounted on the top of printed circuit board 330. The first low pass filter integrated circuit chip 360 may include eight input pins that are electrically connected to eight output pins through eight respective low pass filters that are implemented within the chip 360. A high pass filter integrated circuit chip 362 is mounted to extend downwardly from the bottom of printed circuit board 330. The high pass filter integrated circuit chip 362 may include eight input pins that are electrically connected to eight output pins through eight respective high pass filters that are implemented within the chip 362. A set of eight conductive paths 350 are provided, each of which electrically connects one of the eight metal-plated apertures 336 to a respective input pin on the low pass filter integrated circuit chip 360. A set of eight conductive paths 352 are provided, each of which electrically connects one of the eight metal-plated apertures 336 to a respective input pin on the high pass filter integrated circuit chip 362. Each metal-plated aperture 336 thus acts as signal path splitter as each signal that is input on one of the plug blades 340 is split onto the two conductive paths 350, 352 that are connected to the metal-plated aperture 336 that holds the back end of the plug blade 340.

A set of eight conductive paths 354 are provided which, consistent with the labeling convention discussed above, are individually labeled 354-1 through 354-8 in FIG. 8. As shown in FIG. 8, each of the conductive paths 354 electrically connects one of the eight output pins on the low pass filter integrated circuit chip 360 to a respective one of the eight input pins on the low pass filter integrated circuit chip 364. As is further shown in FIG. 8, a plurality of capacitors 370, 372, 374, 376 are provided. Each of the capacitors 370, 372, 374, 376 is implemented as a plate capacitor that has a first plate on the top layer of the printed circuit board 330 and a second plate on the bottom layer of the printed circuit board 330. The first plate of capacitor 370 is electrically connected to conductive path 354-2, and the second plate of capacitor 370 is electrically connected to conductive path 354-3 through an electrically conductive via 366. The first plate of capacitor 372 is electrically connected to conductive path 354-3, and the second plate of capacitor 372 is electrically connected to conductive path 354-4 through another electrically conductive via 366. The first plate of capacitor 374 is electrically connected to conductive path 354-5, and the second plate of capacitor 374 is electrically connected to conductive path 354-6 through another electrically conductive via 366. The first plate of capacitor 376 is electrically connected to conductive path 354-6, and the second plate of capacitor 376 is electrically connected to conductive path 354-7 through yet another electrically conductive via 366. The operation of capacitors 370, 372, 374, 376 is explained below.

Eight conductive paths 356 are also provided on printed circuit board 330, each of which electrically connects one of the output pins on the low pass filter integrated circuit chip 364 to a respective one of the eight metal-plated apertures 338. Finally, eight conductive paths 358 are provided, each of which electrically connects one of the output pins on the high pass filter integrated circuit chip 362 to a respective one of the eight metal-plated apertures 338.

As the above discussion of FIG. 8 makes clear, two separate conductive paths 380, 382 extend between each metal-plated aperture 336 and its corresponding metal-plated aperture 338. For example, with respect to metal plated aperture 336-1, the conductive path 350-1, the first low pass filter integrated circuit chip 360, the conductive path 354-1, the second low pass filter integrated circuit chip 364 and the conductive path 356-1 together comprise a first conductive path 380-1 that connects aperture 336-1 to aperture 338-1. This first conductive path 380-1 is a "low frequency" conductive path as the low pass filters in integrated circuit chips 360 and 364 will only allow low frequency signals to traverse conductive path 380-1. The conductive path 352-1, the high pass filter integrated circuit chip 362, and the conductive path 358-1 together comprise a second conductive path 382-1 that also connects aperture 336-1 to aperture 338-1. This second conductive path 382-1 is a "high frequency" conductive path as the high pass filter in integrated circuit chip 362 will only allow high frequency signals to traverse conductive path 380-2.

In the embodiment of FIGS. 5-8, the low pass filters in the low pass filter integrated circuit chip 360 and 364 are configured to pass signals with frequencies below about 500 MHZ while blocking signals with frequencies above about 500 MHz. The high pass filters in the high pass filter integrated circuit chip 362 are configured to pass signals with frequencies above about 500 MHZ while blocking signals with frequencies below about 500 MHz. It will be appreciated that each filter will have a transition region where the filter response will transition from passing signals to attenuating signals. The size of this transition region (e.g., in MHz) is dependent on the filter design. It will likewise be appreciated that the 500 MHz cut-off frequency for the low pass filters and the high pass filters discussed above is exemplary in nature, and that any appropriate cut-off frequencies may be selected for the filters depending upon the design objectives.

Currently, various industry standards that apply to, for example, RJ-45 communications plugs and communication jacks, specify various performance characteristics for the plugs and the jacks and the differential pairs thereof. By way of example, the TIA/EIA-568C.2 "Category 6A" standard specifies ranges for near-end crosstalk that must be present between the differential pairs of an RJ-45 communications plug. As noted above, the communications plug 300 may be designed to comply with these performance specifications while also providing enhanced channel capacity at higher frequencies, as will be apparent in light of the following description of the operation of the plug 300.

The plug blades on most conventional plugs include metal plate portions that are aligned in a row. The metal plate portion of each such plug blade may capacitively and inductively couple with the metal plate portions of one or more adjacent plug blades. The metal plate portions may be designed so that the amount of coupling between the differential pairs of the plug will fall within the ranges specified within one or more of the industry standards. In contrast to these conventional plugs, communications plug 300 uses skeletal plug blades 340 that generate reduced amounts of offending crosstalk between the plug blades of adjacent differential pairs. In order to increase the amount of offending crosstalk to bring the plug 300 into compliance with these industry standards, the above-described capacitors 370, 372, 374, 376 are provided that inject offending crosstalk between the differential pairs of plug 300. In particular, capacitor 370 increases the amount of offending crosstalk between pairs 2 and 3, the capacitors 372 and 374 increase the amount of offending crosstalk between pairs 1 and 3, and the capacitor 376 increases the amount of offending crosstalk between pairs 3 and 4. While a total of four capacitors are shown in FIG. 8, it will be appreciated that additional capacitors (or other crosstalk generating structures), which are not shown in FIG. 8, may be provided as necessary to increase the amount of offending crosstalk between differential pairs that do not have adjacent conductors in the plug-jack mating region such as, for example, a capacitor that generates offending crosstalk between pairs 1 and 2 (e.g., a capacitor between conductors 2 and 4) and a capacitor that generates offending crosstalk between pairs 1 and 4 (e.g., a capacitor between conductors 5 and 7).

Notably, the capacitors 370, 372, 374, 376 are located on the low frequency conductive paths 380. As such, the additional offending crosstalk that is generated by these capacitors will only be injected into low frequency signals (which, in the example of FIGS. 5-8, are signals at frequencies less than 500 MHz). As various industry standards may only specify offending crosstalk levels up to a certain cut-off frequency (e.g., 500 MHz), the plug 300 may be designed to inject appropriate amounts of offending crosstalk onto all signals that are at frequencies which fall within the industry standards, thereby providing an industry-standards compliant plug. Moreover, since the plug blades 340 are designed to generate very low levels of offending crosstalk, the amount of crosstalk that will occur between high frequency signals that pass through the plug 300 may be very low as the high frequency conductive paths 382 do not include capacitors for injecting offending crosstalk. These reduced offending crosstalk levels may advantageously facilitate increasing channel capacity at frequencies higher than the frequencies specified in the relevant industry standards. Consequently, communications plug 300 may be designed to comply with industry standards such as the Category 6A standard while simultaneously being designed to support higher data rate communications using frequencies that are above the frequencies specified in the industry standard.

Operation of the communications plug 300 will now be explained in more detail. Referring first to FIG. 5, a differential information signal may enter the plug on the insulation piercing contacts that connect to, for example, the conductors of pair 2 of a cable (not shown) that is attached to plug 300. Referring to FIG. 8, this differential information signal is coupled through the insulation piercing contacts to the metal-plated apertures 338-1 and 338-2, with the first component of the differential information signal passing through aperture 338-1 and the second component passing through aperture 338-2. At metal-plated aperture 338-1, the first component of the differential information signal is passed to the second low pass, filter integrated circuit chip 364 via the conductive path 356-1 and is also passed to the high pass filter integrated circuit chip 362 via the conductive path 358-1. At metal-plated aperture 338-2, the second component of the differential information signal is passed to the second low pass filter integrated circuit chip 364 via the conductive path 356-2 and is also passed to the high pass filter integrated circuit chip 362 via the conductive path 358-2.

If the differential information signal is at a frequency of less than 500 MHz, then first and second low pass filters that are included in the second low pass filter integrated circuit chip 364 allow the two components of the differential information signal to pass through the chip 364 where they are then output onto the conductive paths 354-1 and 354-2. The conductive paths 354-1 and 354-2 then pass the respective components of the differential information signal to the first low pass filter integrated circuit chip 360, where it passes through the corresponding low pass filters therein and is output to the corresponding conductive paths 350-1 and 350-2. The conductive paths 350-1 and 350-2 carry the respective components of the differential information signal to respective metal-plated apertures 336-1 and 336-2 so that the two components of the differential information signal are passed to the plug blades 340-1 and 340-2. Thus, the differential information signal will pass through plug 300 on the low frequency conductive paths 380-1 and 380-2 that are shown in FIG. 8. A portion of the signal on conductive path 354-2 is also capacitively coupled to conductive path 354-3 via the capacitor 370 in order to increase the level of offending crosstalk between pairs 2 and 3 in communications plug 300 for signals at frequencies below 500 MHz to a sufficient level to comply with the relevant industry standards.

In the above example, the differential information signal has a frequency of less than 500 MHz. As such, the portions of the differential information signal that are passed to the high pass filter integrated circuit chip 364 via the conductive paths 358-1 and 358-2 are substantially attenuated by the high pass filters therein, and hence only a very small portion of the differential information signal (i.e., a portion that has been attenuated by 30 or 40 dB) passes through the high pass filter integrated circuit chip 362 onto the conductive paths 352-1 and 352-2 (i.e., very little signal energy is passed through plug 300 on the high frequency conductive paths 382-1 and 382-2). These small portions of the differential information signal that are passed on the high frequency conductive paths 382-1 and 382-2 are then recombined at the metal-plated apertures 336-1 and 336-2 with the portions of the differential information signal that pass through the plug 300 on the low frequency conductive path 380-1 and 380-2 in the manner described above. Thus, the net effect is that almost all of the signal energy of a differential information signal having a frequency of less than 500 MHz will flow through the communications plug 300 on two of the low frequency paths 380, where one (or more) of the capacitors 370, 372, 374, 376 that are on these low frequency paths 380 inject offending crosstalk between the pairs. The amount of offending crosstalk injected by capacitors 370, 372, 374, 376 may be set so that the communications plug 300 will have crosstalk levels that fall within the ranges specified in, for example, the Category 6A standard for signals at frequencies of less than 500 MHz.

If the differential information signal that enters the printed circuit board 330 of plug 300 at, for example, metal-plated apertures 338-1 and 338-2, is at a frequency of greater than 500 MHz, then the low pass filters in the second low pass filter integrated circuit chip 364 substantially attenuate the two components of the differential information signal that are on the conductive paths 356-1 and 356-2 such that only a very small portion of the differential information signal (e.g., the differential signal may be reduced by 30-40 dB) is allowed onto the low frequency conductive paths 380-1 and 380-2. However, the portions of the differential information signal that are passed from the metal-plated apertures 338-1 and 338-2 to the high pass filter integrated circuit chip 362 via conductive paths 358-1 and 358-2 pass through the high pass filters substantially unattenuated and are output onto conductive paths 352-1 and 352-2 where these signals are passed to the plug blades 340-1 and 340-2 that are mounted in metal-plated apertures 336-1 and 336-2. Thus, as shown by the above example, for differential information signals having frequencies above 500 MHz, almost all of the signal energy will pass through the plug 300 on the corresponding high frequency conductive paths 382, and hence the capacitors 370, 372, 374, 376 (which are only included on the low frequency conductive paths 380) will generate essentially no additional offending crosstalk for signals at frequencies exceeding 500 MHz. Thus, for signals that exceed 500 MHz, the communications plug 300 comprises a very low crosstalk plug (since the crosstalk between the plug blades 340 may be far lower than the crosstalk generated in conventional plugs). This reduction in the crosstalk generated in the plug 300 may allow the plug 300 to support higher data rates at frequencies above 500 MHz.

In some embodiments, the first low pass filter integrated circuit chip 360 may be located very close to the metal-plated apertures 336, and the capacitors 370, 372, 374, 376 may connect to the conductive paths 354 at or very close to the output pins of the first low pass filter integrated circuit chip 360. Such an arrangement may advantageously inject the offending crosstalk close in distance and time to the point where each plug blade 340 mates with a corresponding contact of a mating communications jack. Reducing the amount of delay between the point where the offending crosstalk is injected and the compensation circuit in the mating jack that is designed to compensate for this offending crosstalk may result in more complete crosstalk cancellation.

As shown above, pursuant to embodiments of the present invention, communications connectors are provided that include two or more electrically parallel conductive paths between each input contact and its corresponding output contact. Each of these paths may be configured to pass signals in different (although possibly overlapping) frequency ranges. Appropriate signal conditioning circuitry may be provided along each of these parallel paths. For example, with the communications plug 300 of FIGS. 5-8, capacitors 370, 372, 374, 376 are provided that inject offending crosstalk on the low frequency conductive paths 380 so that the plug 300 will be an industry standards compliant plug. No signal conditioning is provided on the high frequency conductive paths 382, although these communication paths do benefit from the provision of the low crosstalk plug blades 340 which allow the plug 300 to exhibit lower than normal offending crosstalk levels at frequencies above 500 MHz while still operating as an industry standards compliant plug at frequencies below 500

MHz. Thus, the provision of electrically parallel low and high frequency conductive paths 380, 382 allows the plug 300 to exhibit high performance levels over a broader range of frequencies.

It will be appreciated that the communications plug 300 is exemplary in nature, and that various modifications may be made thereto in actual implementations. By way of example, the plug 300 includes four capacitors 370, 372, 374, 376 that are used to inject offending crosstalk between pairs 2 and 3, pairs 1 and 3 and pairs 3 and 4. In other embodiments, more or fewer capacitors could be provided for injecting offending crosstalk, and offending crosstalk could be injected between additional and/or between different pair combinations. It will likewise be appreciated that inductive coupling structures such as closely spaced conductive traces could additionally or alternatively be provided and/or different capacitor designs (e.g., lumped elements, interdigitated finger capacitors, etc.) could be used to inject the offending crosstalk. As another example, the low pass filters and/or high pass filters may be implemented on less than all pairs of conductors.

As another example, the communications plug 300 only performs signal conditioning on the low frequency conductive paths 380 (namely, the injection of offending crosstalk between selected differential pairs), and does not perform any signal conditioning on the high frequency conductive paths 382. In other embodiments, signal conditioning may alternatively or additionally be performed on the high frequency conductive paths 382. In such embodiments, the high frequency conductive paths may include first and second high pass filter integrated circuit chips (as opposed to the single chip 362 provided in plug 300) in order to isolate the effects of this signal conditioning from the low frequency conductive paths.

Another modification that could be made to the communications plug 300 is the provision of more than two electrically parallel paths 380, 382. For example, in further embodiments, three or more electrically parallel paths could be provided between the plug blades 340 and the output contacts 332, with each path designed to pass signals at certain frequencies while blocking signals at other frequencies.

It will also be appreciated that in some embodiments one of the first and second low pass filter integrated circuit chips 360, 364 could be omitted. For example, one of the first and second low pass filter integrated circuit chips 360, 364 might be omitted in an alternate plug design that replaced the capacitors 370, 372, 374 and 376 with inductive coupling structures. It will also be appreciated that the low pass and high pass filters may be implemented at least in part using capacitors and/or inductors that are provided within plug 300 for other reasons such as for crosstalk compensation, return loss control, etc.

It will further be appreciated in light of the present disclosure that improved performance may be achieved by providing plug and jack communications connectors that both have multiple electrically parallel conductive paths between their input and output contacts. By way of example, the communications plug 300 of FIGS. 5-8 exhibits low offending crosstalk levels for high frequency signals, but higher offending crosstalk levels for low frequency signals (due to the provision of the capacitors 370, 372, 374, 376 that inject offending crosstalk). Thus, if plug 300 is mated with a jack that includes a single crosstalk compensation circuit, it may be difficult to cancel high levels of crosstalk across all frequency ranges due to the different amounts of crosstalk injected in the plug 300 on the low and high frequency conductive paths 380, 382. Consequently, pursuant to further embodiments of the present invention communications jacks are provided that likewise have low and high frequency conductive paths with different signal conditioning thereon that may be designed to complement the signal conditioning provided on the low and high frequency conductive paths 380, 382 of a mating communications plug such as plug 300.

Figure 9:
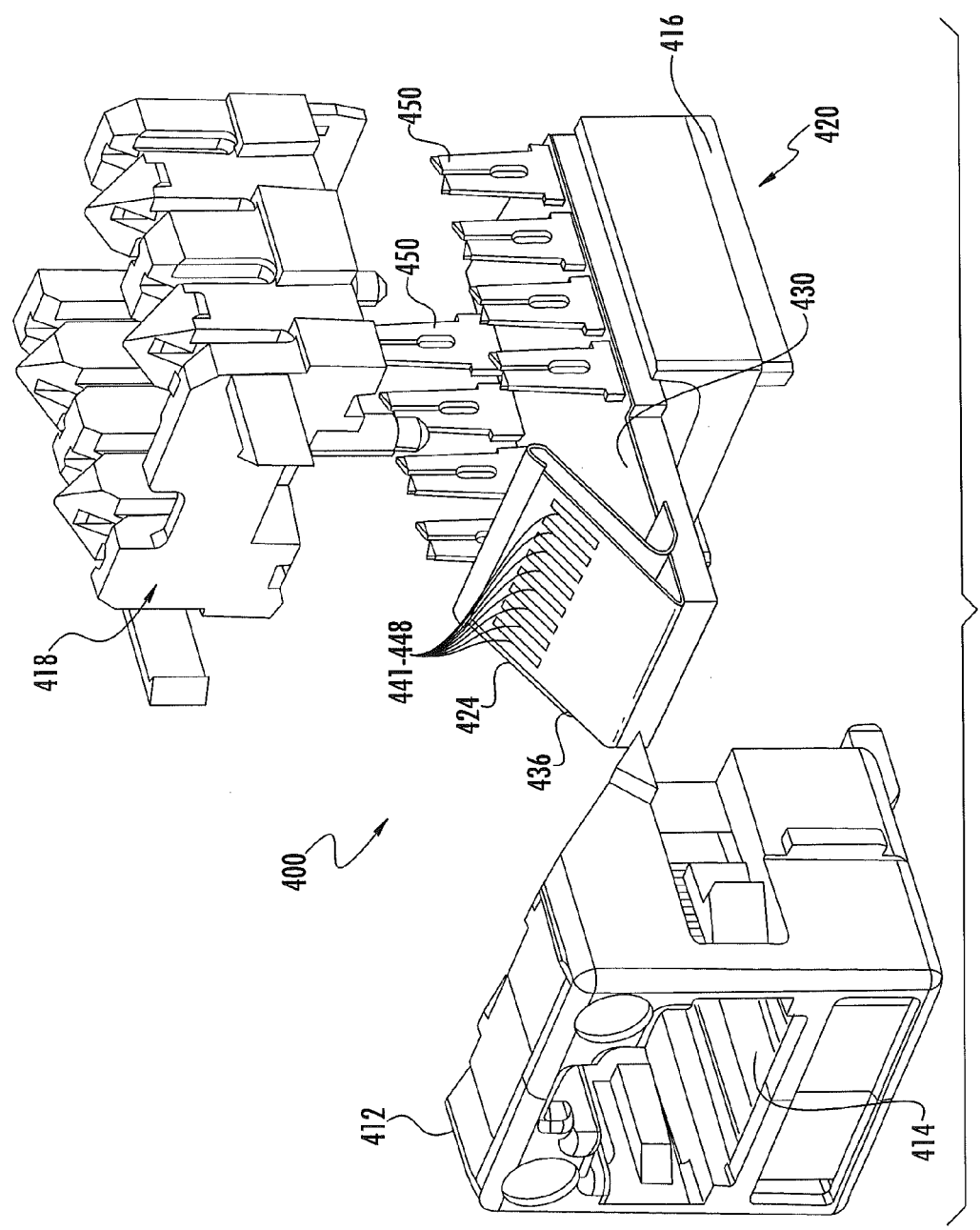
FIG. 9 is a perspective view of a communications jack according to embodiments of the present invention.
Figure 10:
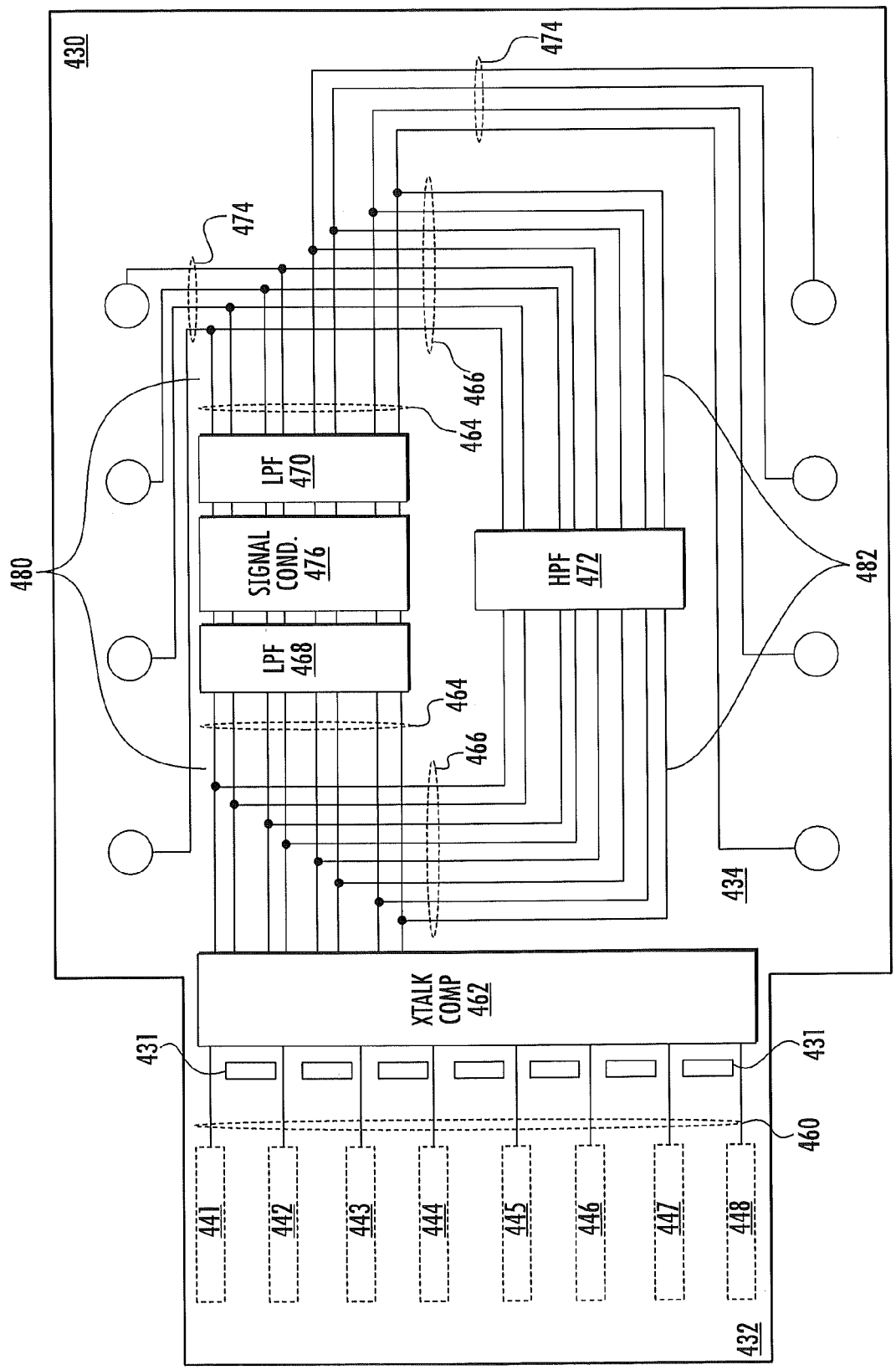
FIG. 10 is a schematic plan view of a flexible printed circuit board of the communications jack of FIG. 9.

FIGS. 9 and 10 illustrate a communications jack 400 according to embodiments of the present invention that is designed to work in conjunction with communications plug 300 to provide improved performance over a wide range of frequencies. In particular, FIG. 9 is a perspective view of the communications jack 400, and FIG. 10 is a schematic plan view of a flexible printed circuit board of the communications jack 400.

As shown in FIG. 9, the jack 400 includes a three piece housing 400 that includes a jack frame 412 having a plug aperture 414 for receiving a mating plug, a cover 416 and a terminal housing 418. The housing components 412, 416, 418 may be conventionally formed and not need be described in detail herein.

The jack 400 further includes a communications insert 420. The communications insert 420 comprises a substrate 422 that has a spring 424, a flexible printed circuit board 430 and a plurality of output terminals 470 mounted thereon. The communications insert 420 is received within an opening in the rear of the jack frame 412. The bottom of the communications insert 420 is protected by the cover 416, and the top of the communications insert 420 is covered and protected by the terminal housing 418.

The spring 424 and the flexible printed circuit board 430 are both mounted on a top surface of the substrate 422. The printed circuit board 430 may include a plurality of apertures 431. The spring 424 may include a plurality of downwardly-extending extensions that extend through the apertures 431 and are used to mount the spring 424 in the substrate 422. The spring 424 may comprise, for example, a flexible cantilevered member that extends upwardly at an angle from the substrate 422 through the openings 431 in the flexible printed circuit board 430. A front portion 432 of the flexible printed circuit board 430 is bent back over the substrate 422 so as to expose the bottom surface 436 of the front portion 432 of the flexible printed circuit board 430. The top surface 434 of the front portion 432 of the flexible printed circuit board 430 may rest against the spring 424. The very front portion of the flexible printed circuit board 430 may be mounted to the distal end of the spring 424 by any conventional mounting mechanism (e.g., a screw, an adhesive, etc.).

Eight rectangular contact pads 441-448 are provided on the bottom surface 436 of the front portion 432 of flexible printed circuit board 430. The eight contact pads 441-448 are positioned within the plug aperture 414 so that they will make physical and electrical contact with the respective blades of a mating communications plug that is received within the plug aperture 414. As the front portion of the flexible printed circuit board 430 is attached to the spring 424, the spring 424 may ensure that each contact pad engages its respective mating plug blade with a sufficient contact force to provide a good electrical connection therebetween.

Figure 2:
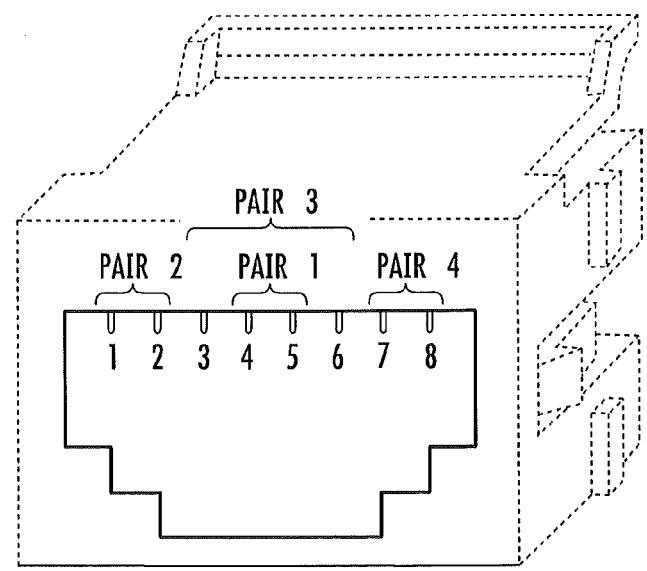
FIG. 2 is a schematic diagram illustrating the modular jack contact wiring assignments for a conventional 8-position communications jack (TIA 568B) as viewed from the front opening of the jack.

The contact pads 441-448 are arranged in pairs defined by TIA 568B (see FIG. 2 and discussion thereof above). The output terminals 450 are mounted in the substrate 422 through respective metal-plated apertures in the flexible printed circuit board 430. Conductive traces (not shown) are provided on the flexible printed circuit board 430 that connect each contact pad 441-448 to a respective one of the metal-plated apertures that hold the output terminals 450, thereby electrically connecting each contact pad 441-448 to its respective output terminal 450. In the depicted embodiment, each output terminal 450 is implemented as an IDC. As is well known to those of skill in the art, an IDC is a type of wire connection terminal that may be used to make mechanical and electrical connection to an insulated wire conductor. Terminal cover 418 includes a plurality of pillars that cover and protect the IDCs 450. Adjacent pillars are separated by wire channels. The slot of each of the IDCs 450 is aligned with a respective one of the wire channels. Each wire channel is configured to receive a conductor of a communications cable so that the conductor may be inserted into the slot in a respective one of the IDCs 450.

As noted above, the jack 400 may be designed to have multiple electrically parallel low and high frequency conductive paths that complement the corresponding low and high frequency conductive paths of the communications plug 300. In the jack 400, these electrically parallel conductive paths 380, 382 are implemented on the flexible printed circuit board 430, as shown in FIG. 10.

As shown in FIG. 10, a plurality of conductive paths 460 are connected to the contact pads 441-448. Various crosstalk compensation circuit elements 462 may be provided along these conductive paths 460 to compensate for crosstalk that arises in a mating plug and between the input contacts 441-448. While the crosstalk compensation circuit elements 462 are illustrated for simplicity using a single block in FIG. 10, it will be appreciated that the crosstalk compensation circuit elements 462 will typically comprise a plurality of individual crosstalk compensation circuits, at least some of which may comprise multi-stage crosstalk compensation circuits that includes multiple time-delayed compensation components.

As is further shown in FIG. 10, each conductive path 460 is split into first and second conductive paths 464, 466. Each of the conductive paths 464 is part of a plurality of low frequency conductive paths 480, while each of the conductive paths 466 is part of a plurality of high frequency conductive paths 482. As shown in FIG. 10, a first bank of low pass filters 468 and a second bank of low pass filters 470 are provided on the low frequency conductive paths 480 so that only low frequency signals may traverse the jack 400 on the low frequency conductive paths 480. A bank of high pass filters 472 is provided on the high frequency conductive paths 482 so that only high frequency signals may traverse the jack 400 on the high frequency conductive paths 482. The banks of low pass and high filters 468, 470, 472 may be implemented using low and high pass filter integrated circuit chips that are identical to the low pass and high pass filter integrated circuit chips discussed above with respect to communications plug 300, and hence further description thereof will be omitted. As is further shown in FIG. 10, each conductive path 464 is combined with its corresponding (parallel) conductive path 468 at the outputs of the low pass filters 470 and the high pass filters 472. Conductive traces 474 connect each combined trace to its corresponding IDC aperture that hold the IDCs 450.

As is further shown in FIG. 10, an additional crosstalk compensation circuit 476 is provided along the low frequency conductive paths 480. The crosstalk compensation circuit 476 may provide additional crosstalk compensation to compensate for the additional offending crosstalk that is added by capacitors 370, 372, 374, 376 in the communications plug 300. The crosstalk compensation circuit 476 may comprise a plurality of single stage and/or multi-stage crosstalk compensation circuits that are designed to compensate for the offending crosstalk that is injected by the capacitors 370, 372, 374, 376, and may include capacitive components and/or inductive components. As discussed above, the capacitors 370, 372, 374, 376 only inject additional offending crosstalk on low frequency signals, and the crosstalk compensation circuit 476 is likewise designed to only inject compensating crosstalk with respect to low frequency signals as the circuit 476 is only implemented on the low frequency conductive paths 480. The crosstalk compensation circuit 476 thus acts to provide additional crosstalk compensation for low frequency signals that compensates for the additional offending crosstalk added by capacitors 370, 372, 374, 376 without providing any additional crosstalk compensation for high frequency signals. Consequently, the jack 400 may provide the appropriate amount of crosstalk compensation for both low and high frequency signals.

It will be appreciated that many modifications may be made to the communications jack 400 without departing from the scope of the present invention. By way of example, in further embodiments, additional signal conditioning may be performed along the high frequency conductive paths 482. In such embodiments, the high frequency conductive paths 482 may include first and second banks of high pass filters with the signal conditioning circuitry located therebetween in order to isolate this signal conditioning circuitry from the low frequency conductive paths. Another modification that could be made to the communications jack 400 is the provision of more than two sets of parallel paths 480, 482. As yet another example, the jack 400 could be modified to only perform signal conditioning and/or parallel paths on some of the conductive paths through the jack.

It will also be appreciated that additional and/or different types of signal conditioning could be performed on the low and high frequency conductive paths 480, 482. By way of example, in further embodiments, a first multistage crosstalk compensation circuit could be provided on the low frequency conductive paths 480 and a second multistage crosstalk compensation circuit could be provided on the high frequency conductive paths 482. These multi-stage crosstalk compensation circuits would be in addition to the crosstalk compensation circuit 462, and may be designed to provide some of the crosstalk compensation that otherwise would be injected by crosstalk compensation circuit 462. The multi-stage crosstalk compensation circuits that are added to the low and high frequency conductive paths 480, 482 could be designed to optimize performance over different frequency ranges to enhance the crosstalk cancellation performance of the jack 400 over a wider frequency range. Thus, it will be appreciated that the communications jack 400 is exemplary in nature and is described to illustrate the concept of using parallel conductive paths, at least one of which is limited to a specific frequency band or bands, in order to provide enhanced performance.

It will be appreciated that according to further embodiments of the present invention plugs and jacks may be provided that do not include any high pass filters (or band pass filters) along the conductive paths that are implemented in parallel to the low frequency conductive paths. In such embodiments, the connector may include a plurality of conductive paths that pass signals at all frequencies ("all frequency conductive paths") that are in parallel to respective ones of a plurality of low frequency conductive paths. In these connectors, low frequency signals (e.g., signals having frequencies of less than 500 MHz) may traverse both sets of parallel conductive paths through the connector, while higher frequency signals will only traverse the all frequency conductive paths, as the low pass filters block such higher frequency signals from the low frequency conductive paths. The signal conditioning circuits on the low frequency conductive paths (e.g., capacitors 370, 372, 374, 376 on plug 300 or circuit 476 on jack 400) may be appropriately modified to inject the appropriate amount of offending or compensating crosstalk.

Figure 11A:
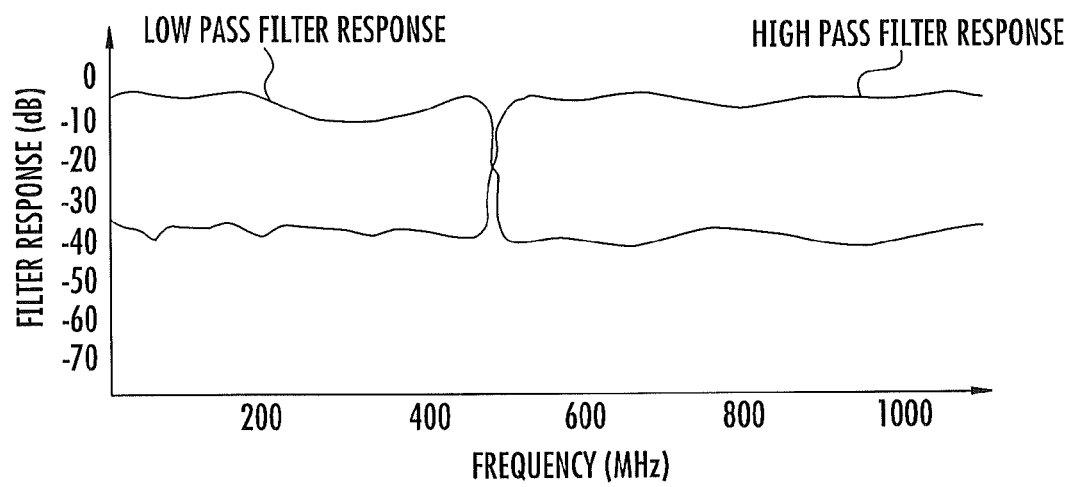
FIG. 11A is a graph schematically illustrating the frequency response of the low pass filters and high pass filters according to some embodiments of the present invention.

As discussed above, in some embodiments, a first plurality of conductive paths may be designed to pass signals having a frequency lower than a selected cutoff frequency, while a second plurality of conductive paths may be designed to pass signals having a frequency higher than the selected cutoff frequency. In such embodiments, low pass filters may be provided on the first plurality of conductive paths and high pass filters may be provided on the second plurality of conductive paths. These low and high pass filters may be designed to have sharp transition regions between the pass band and blocking band of the filter response, and the transition regions of the low pass filters and high pass filters may cross each other. FIG. 11A schematically illustrates exemplary frequency responses for such low pass and high pass filters. As can be seen from FIG. 11A, both the low pass and high pass filters transition from the pass band to the blocking band in the space of less than bout 10 MHz, with the low and high pass filter responses crossing each other at about 500 MHz.

Figure 11B:
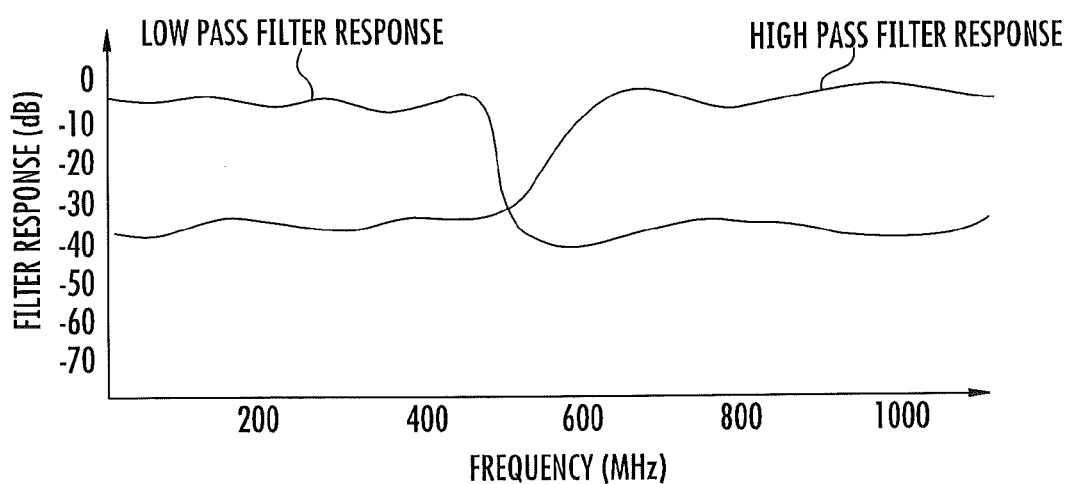
FIG. 11B is a graph schematically illustrating the frequency response of the low pass filters and high pass filters according to further embodiments of the present invention.

In other embodiments, the low pass filters and high pass (or band pass) filters may be designed so that their transition regions do not cross. FIG. 11B schematically illustrates exemplary frequency responses for a connector design that includes low pass filters and high pass filters that have a "null" response therebetween. In particular, as shown in FIG. 11B, the low pass filter has a response that passes signals of about 500 MHz and below, while the high pass filter has a response that passes signals of about 600 MHz and above. These responses trail off more slowly, and there is a distinct null where signals in the range of about 525 MHz to 575 MHz will not pass on either of the first and second sets of conductive paths. In connectors that utilize the approach illustrated in FIG. 11B, the devices that transmit signals through the connector may be designed so that they do not transmit signals at the frequencies associated with the null.

As shown in FIGS. 11A and 11B, the low pass filters and high pass filters used in the connectors according to embodiments of the present invention will not exhibit infinite isolation. Instead, it is anticipated that typical filter designs will attenuate the signals by 20 dB or more in the blocking band of the filter response. As such, it will be appreciated that even when a connector according to embodiments of the present invention is designed to have signals input thereto travel through the connector on only a first of two parallel paths, in reality a small portion of the signal will flow on the second parallel path and be recombined with the signal that travels on the first parallel path at the opposite end of the connector.

In some embodiments, the connectors according to embodiments of the present invention may use multi-layer printed circuit boards that include conductive traces on their top and bottom surfaces as well as additional conductive surfaces on interior layers thereof. In such embodiments, some or all of the high frequency conductive traces (or portions thereof) may be implemented on interior layers of the multi-layer printed circuit boards. Typically, the current carrying traces on RJ-45 plug and jack printed wiring boards are disposed on either the top or bottom layers of the printed circuit board so that these traces can handle specified surge current levels without destroying the printed circuit board and/or without catching fire. However, as the surge currents are DC currents, these currents will not flow to the high frequency conductive paths, and hence the high frequency conductive paths may be implemented on interior layers of the printed circuit board. The traces for the high frequency paths may also be significantly smaller than the printed circuit board traces included in conventional RJ-45 plugs and jacks such as, for example, printed circuit board traces having widths of 3.0 mil or even less.

As set forth above, embodiments of the present invention provide improved communications plugs and jacks that implement different levels of electrical performance (e.g., crosstalk) for different frequency bands. For example, in some embodiments, RJ-45 plugs and jacks are provided that may provide better than 10 G performance by using a first signal channel for signals below 500 MHz and a second, parallel signal channel for signals above 500 MHz that are sufficiently isolated from each other via, for example, a crossover network with a crossover frequency of 500 MHz. The high frequency channel may, for example, be optimized for maximizing channel capacity, with reduced levels of NEXT, FEXT, return loss, insertion loss and conversion loss for signals having frequencies between 500 MHz and, for example, 2 GHz. The low frequency channel may be designed to have the necessary levels of NEXT and FEXT, insertion loss, return loss and conversion loss to be compliant with the relevant industry standards such as, for example, the Category 6A standard for signals in the frequency range of 1 MHz to 500 MHz. As a result, industry standards' compliant plugs and jacks can be provided that may exhibit better than 10 G performance. In some embodiments, the high frequency channel may be replaced with a channel that passes all frequencies.

While the communications plug 300 uses one exemplary type of low-crosstalk plug blade, it will be appreciated that numerous other low-crosstalk plug blade designs could be used. For example, in other embodiments, the plug may be designed so that the current runs in opposite directions through adjacent plug blades that are part of different differential pairs. This could be accomplished, for example, by connecting the traces 350 and 352 to metal-plated aperture 334 instead of to metal-plated aperture 336 for plug blade 340-1, 340-2, 340-4 and 340-5. Since the currents flow through different parts of adjacent plug blades 340 that are part of different differential pairs (i.e., either the front portion or the rear portion) and flow in opposite directions on such adjacent plug blades 340; there is less inductive coupling between adjacent plug blades that are part of different differential pairs. As another example, the conductive paths 352 may connect to the metal-plated apertures 336 while the conductive paths 350 connect to the metal-plated apertures 334 which may facilitate further, controlling impedance and/or crosstalk. As yet another example, the plug blades 340 could be replaced with contact pads that are disposed on the top and front surface of the printed circuit board 330 that are configured to physically contact the contacts of a mating jack. The use of contact pads as plug blades can further decrease the capacitive and/or inductive coupling between adjacent plug blades.

While embodiments of the present invention have primarily been discussed herein with respect to communications plugs and jacks that include eight conductive paths that are arranged as four differential pairs of conductive paths, it will be appreciated that the concepts described herein are equally applicable to connectors that include other numbers of differential pairs. It will also be appreciated that communications cables and connectors may sometimes include additional conductive paths that are used for other purposes such as, for example, providing intelligent patching capabilities. The concepts described herein are equally applicable for use with such communications cables and connectors, and the addition of one or more conductive paths for providing such intelligent patching capabilities or other functionality does not take such cables and connectors outside of the scope of the present invention or the claims appended hereto.

While the present invention has been described above primarily with reference to the accompanying drawings, it will be appreciated that the invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, the terms "attached", "connected", "interconnected", "contacting", "mounted" and the like can mean either direct or indirect attachment or contact between elements, unless stated otherwise.

Note that in the claims appended hereto, references to "each" of a plurality of objects (e.g., plug blades) refers to each of the objects that are positively recited in the claim. Thus, if, for example, a claim positively recites first and second of such objects and states that "each" of these objects has a certain feature, the reference to "each" refers to the first and second objects recited in the claim, and the addition of a third object that does not include the feature is still encompassed within the scope of the claim. Likewise, if the claim recites a plurality of objects and states that "each" of these objects has a certain feature, the reference to "each" refers to at least two of the objects, and the addition of a third object that does not include the feature is still encompassed within the scope of the claim.

Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
   a plurality of inputs that are arranged as differential pairs of inputs;
   a plurality of outputs that are arranged as differential pairs of outputs;
   a plurality of low frequency conductive paths that are configured to pass signals having frequencies in a first frequency band while substantially attenuating signals having frequencies in a second frequency band that includes higher frequencies than the first frequency band, each of the low frequency conductive paths electrically connecting a respective one of the inputs to a respective one of the outputs; and
   a plurality of second conductive paths, wherein each of the plurality of second conductive paths is electrically in parallel with at least a portion of a respective one of the low frequency conductive paths.

2. The communications connector of claim 1, wherein the second conductive paths comprise a plurality of high frequency conductive paths that are configured to pass signals having frequencies in the second frequency band.

3. The communications connector of claim 2, wherein the inputs comprise input contacts that are configured to receive the respective conductors of a communications cable, and wherein the outputs comprise output contacts that are configured to mate with the respective contacts of a mating communications connector.

4. The communications connector of claim 3, wherein the communications connector is a communications plug that is connected to the communications cable, and wherein the communications cable includes at least four differential pairs of insulated conductors and wherein the low frequency conductive paths comprise four pairs of tip and ring low frequency conductive paths.

5. The communications connector of claim 4, further comprising a printed circuit board, wherein the input contacts and the output contacts are each mounted on the printed circuit board.

6. The communications connector of claim 5, wherein at least some of the high frequency conductive paths are at least partially on an inner layer of the printed circuit board.

7. The communications connector of claim 4, wherein a low pass filter is provided on each of the low frequency conductive paths and a high pass filter or bandpass filter is provided on each of the high frequency conductive paths.

8. The communications connector of claim 4, further comprising a reactive circuit between a first of the tip low frequency conductive paths and a first of the ring low frequency conductive paths.

9. The communications connector of claim 8, wherein the first of the tip low frequency conductive paths is connected to a first of the output contacts and the first of the ring low frequency conductive paths is connected to a second of the output contacts, and wherein the first and second of the output contacts comprise adjacent output contacts.

10. The communications connector of claim 4, further comprising a reactive circuit between a first of the tip high frequency conductive paths and a second of the tip high frequency conductive paths or between a first of the ring high frequency conductive paths and a second of the ring high frequency conductive paths.

11. The communications connector of claim 4, wherein the output contacts are arranged as four differential pairs of output contacts, the communications connector further comprising a first capacitor that injects crosstalk between a first and a second of the differential pairs of output contacts that has the same polarity as the net crosstalk injected between the first and the second differential pairs of output contacts.

12. The communications connector of claim 2, wherein the low frequency conductive paths are configured to pass signals having frequencies between at least 1 MHz and 500 MHz, and wherein the high frequency conductive paths are configured to pass signals having frequencies within at least part of the frequency band between 500 MHz and 3 GHz.

13. The communications connector of claim 2, wherein the first and second frequency bands do not overlap.

14. The communications connector of claim 2, wherein each of the high frequency conductive paths electrically connect a respective one of the inputs to a respective one of the outputs.

15. The communications connector of claim 1, in combination with a communications cable that has a plurality of conductors, wherein the communications connector is attached to an end of the communications cable to provide a patch cord, and wherein each of the plurality of inputs is electrically connected to a respective one of the conductors of the communications cable.

16. The communications connector of claim 1, further comprising a splitter circuit that connects each of the low frequency conductive paths and each of the second conductive paths to respective ones of the inputs and a combiner circuit that connects each of the low frequency conductive paths and each of the second conductive paths to respective ones of the outputs.

17. The communications connector of claim 1, further comprising a crosstalk circuit that is configured to inject crosstalk having the same polarity as crosstalk that is injected between a first of the differential pair of inputs and a second of the differential pair of inputs.

* * * * *